US006259326B1

(12) United States Patent
Dunlop et al.

(10) Patent No.: US 6,259,326 B1
(45) Date of Patent: Jul. 10, 2001

(54) CLOCK RECOVERY FROM A BURST-MODE DIGITAL SIGNAL EACH PACKET OF WHICH MAY HAVE ONE OF SEVERAL PREDEFINED FREQUENCIES

(75) Inventors: Alfred Earl Dunlop, Murray Hill; Wilhelm Carl Fischer, Westfield; Yusuke Ota, Mountain Lakes, all of NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/379,407

(22) Filed: Aug. 24, 1999

(51) Int. Cl.⁷ ............................... H03L 7/06; H03B 5/24; H03D 3/24
(52) U.S. Cl. ................................. 331/2; 331/23; 331/57; 331/179; 375/376
(58) Field of Search .................................. 331/2, 23, 57, 331/74, 179; 375/376

(56) References Cited

U.S. PATENT DOCUMENTS 5,237,290   8/1993  Banu et al. ............................. 331/2
5,608,357 * 3/1997  Tu et al. ................................. 531/57

OTHER PUBLICATIONS

Doros et al., "An Experimental 224 Mb/s Digital Repeatered Line", Bell System Technical Journal, vol. 45, No. 7, pp. 993–1043. Sep. 1966.

R. R. Cordell et al., A 50 Mhz Phase and Frequency–Locked Loop, IEEE Journal of Solid State Circuits, vol. SC14, No. 6, pp. 1003–1010, Dec. 1979.

* cited by examiner

Primary Examiner—David Mis
(74) Attorney, Agent, or Firm—Eugene J. Rosenthal

(57) ABSTRACT

The clock may be recovered rapidly for burst mode signals that are at one of a set of different a priority known frequencies by using a single device that is similar to that of U.S. Pat. No. 5,237,290 except that the delay lines used in each of the gated oscillators are controllably selectable so that the gated oscillators are each capable of providing a clock signal at more than one frequency. Typically, the same frequency is selected for use by both of the gated oscillators at any one time. This is achieved by having each gated oscillator be made up of 1) a plurality of "internal" gated oscillators that each have different length delay lines, and 2) a selector for selecting the output of one of the internal gated oscillators that is to be used for a particular frequency. The internal gated oscillators may be made up of delay elements. The ratio of the number of delay elements in the various internal gated oscillators to each other determines their relative frequency. When the delay elements that make up the internal gated oscillators are inverters, a phase splitter may be employed to insure that the number of delay elements effectively remains odd to insure that oscillation takes place even when a ratio of two in the frequencies recovered is required.

27 Claims, 4 Drawing Sheets

CLOCK RECOVERY FROM A BURST-MODE DIGITAL SIGNAL EACH PACKET OF WHICH MAY HAVE ONE OF SEVERAL PREDEFINED FREQUENCIES

TECHNICAL FIELD

This invention relates to recovering a clock from a transmitted burst-mode digital signal each packet of which may have one of several predefined frequencies.

BACKGROUND OF THE INVENTION

Traditionally, digital signals are transmitted sequentially: each bit is sent for a constant amount of time and during a precisely defined interval of time. Typically, the time interval is defined for the transmitter by an electronic metronome known to those skilled in the art as a "clock signal" (hereinafter "clock"). A clock is typically generated by a crystal oscillator and is often embodied as electric square-wave signal with constant frequency and a 50% duty cycle.

To assure that the receiver correctly interprets the incoming data signals, the receiver must selectively read the incoming data signals only at instants when the signals have stabilized and not when they are undergoing transition. This requires the receiver to know when the incoming data signals are stable and when they are not. Advantageously, the receiver also has an electronic metronome, synchronized to the incoming data signal which dictates "read now-wait, read now-wait, read now-wait. . . ." Typically, the receiver has information regarding the frequency or frequencies of the transmitter's clock and has a clock with that same frequency. The receiver's clock, however, will, without more, bear no phase relationship to the incoming data signal and thus the receiver will have no synchronized metronome to assist it in reading the incoming data signal.

To generate a clock which is synchronized with respect to the incoming data signal, the receiver may advantageously utilize a "clock recovery system". At least two clock recovery techniques are currently known. First, the transmitter's clock may be transmitted to the receiver on a communication channel in parallel to the channel carrying the incoming data signals. The receiver can then use this second channel as a clock with proper phase to determine when to read the data on the first channel. This technique, however, is disadvantageous in that it requires additional hardware, e.g., the extra communication channel, and is subject to phase skew between the transmitted clock and the incoming data signal.

Alternately, the phase of the incoming data signals may be recovered directly from the incoming data signals themselves because the incoming data signals carry the information needed to discern its phase. At least two techniques are known which recover the phase of the incoming data signals from the incoming data signals themselves.

The first is the open-loop clock recovery system representatively taught by I. Dorros et al., An Experimental 224 Mb/s Digital Repeatered Line, The Bell System Technical Journal, Vol. 45, No. 7, pp. 993–1043 (September 1966). Open-loop systems are characterized by a highQ, narrow bandpass filter, e.g., a SAW filter, yet may be disadvantageous in that they typically require expensive nonintegrated components, hundreds of incoming data signal transitions to reach steady state and may be susceptible to temperature variations and age.

The second is the closed-loop clock recovery system. A representative closed-loop clock recovery system is taught by R. R. Cordell et al. in A 50 MHz Phase and Frequency-Locked Loop, IEEE Journal of Solid State Circuits, Vol. SC14, No. 6, pp. 1003–1010 (December 1979). Closed-loop systems are characterized by a phase-locked loop which attempts to lock onto the phase of the incoming data signal. While closed-loop recovery systems are self adjusting, thus mitigating temperature and aging effects, and can be easily integrated, they are disadvantageous in typically requiring hundreds of incoming data signal transitions to reach steady state.

While these clock recovery mechanisms may be satisfactory for non-burst mode signals which have some signal being constantly transmitted, they may be disadvantageous for burst mode signals in which arbitrary phase changes may exist between consecutive packets of the signal.

U.S. Pat. No. 5,237,290, which is incorporated by reference as if set forth herein in its entirety, provides a method and apparatus for recovering the phase of a signal while avoiding many of the costs and restrictions associated with prior apparatus and methods. The system described therein is ideally suited for use with burst mode signals in that it typically generates a recovered clock more quickly than other methods in the prior art. These results are obtained by feeding an incoming data signal into a gated oscillator while the complement of the incoming data signal is fed into a matching gated oscillator. The respective outputs of the two oscillators are fed into a NOR gate. When the gated oscillators are designed to oscillate at the frequency of the incoming data signal, the output waveform from the NOR gate will be a continuous clock that has a bounded phase relationship with respect to the incoming data signal, i.e., the recovered clock and the incoming data signal will have the same frequency and their relative phase will remain within a given range.

Disadvantageously, the system disclosed in U.S. Pat. No. 5,237,290 can only operate at a single frequency.

SUMMARY OF THE INVENTION

We have recognized that the clock may be recovered rapidly for burst mode signals that are at one of a set of different a priorily known frequencies by using a single device that is similar to that of U.S. Pat. No. 5,237,290 except that the delay lines used in each of the gated oscillators are controllably selectable so that the gated oscillators are each capable of providing a clock signal at more than one frequency. Typically, the same frequency is selected for use by both of the gated oscillators at any one time.

This is achieved, in one embodiment of the invention, by having each gated oscillator be made up of 1) a plurality of "internal" gated oscillators that each have different length delay lines, and 2) a selector for selecting the output of one of the internal gated oscillators that is to be used for a particular frequency. The internal gated oscillators may be made up of delay elements. The ratio of the number of delay elements in the various internal gated oscillators to each other determines their relative frequency. In another embodiment of the invention, each gated oscillator may be made up of a controllably variable delay chain.

In accordance with an aspect of the invention, when the delay elements that make up the internal gated oscillators are inverters, a phase splitter may be employed to insure that the number of delay elements effectively remains odd to insure that oscillation takes place even when a ratio of two in the frequencies recovered is required.

DETAILED DESCRIPTION

Figure 1:
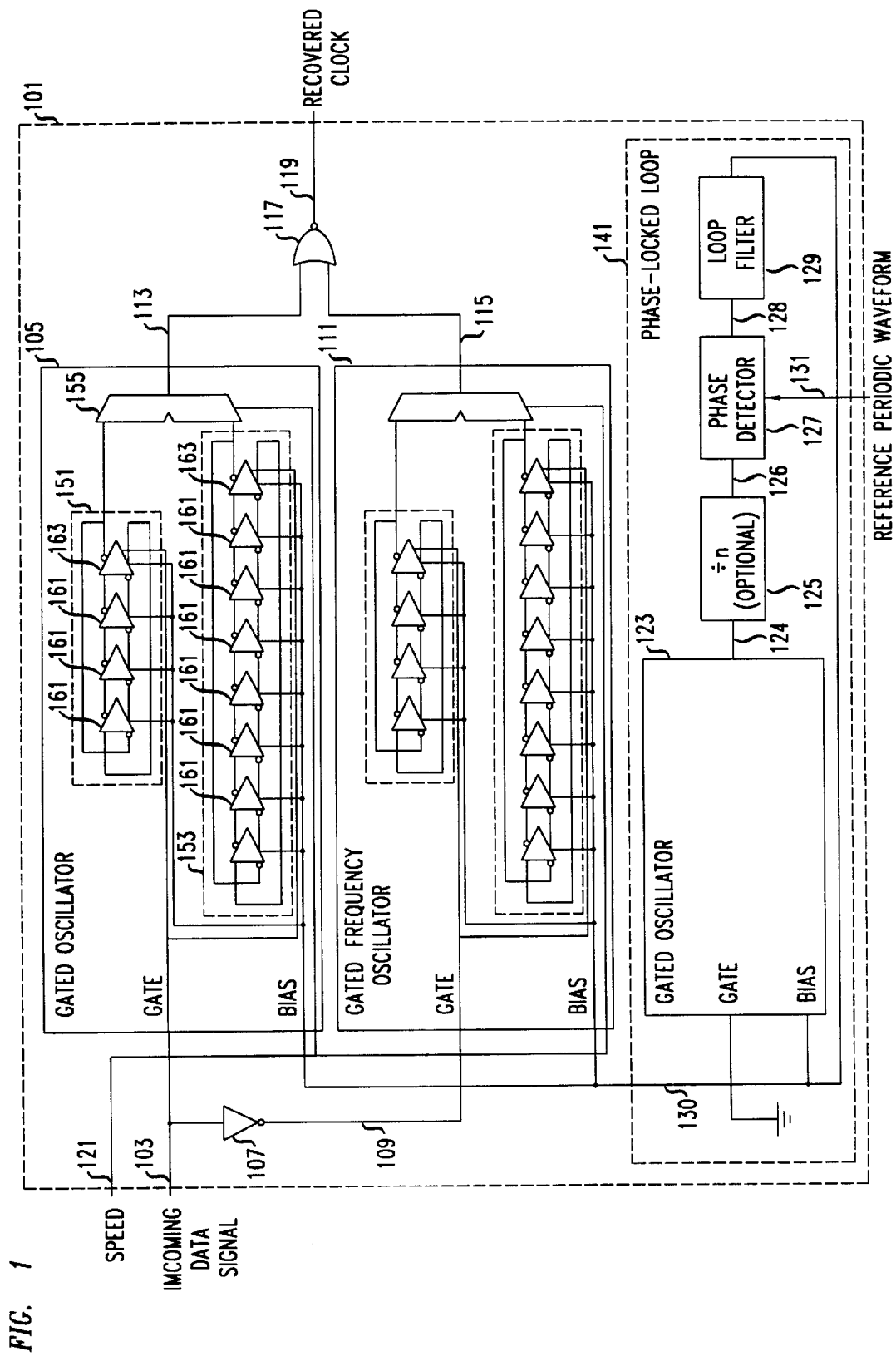
FIG. 1 shows a block diagram of one embodiment of a clock recovery circuit in accordance with the principles of the invention.

The following merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the block diagrams herein represent conceptual views of illustrative circuitry embodying the principles of the invention. Similarly, it will be appreciated that any flow charts, flow diagrams, state transition diagrams, pseudocode, and the like represent various processes which may be substantially represented in computer readable medium and so executed by a computer or processor, whether or not such computer or processor is explicitly shown.

The functions of the various elements shown in the FIGs., including functional blocks labeled as "processors" may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, read-only memory (ROM) for storing software, random access memory (RAM), and non-volatile storage. Other hardware, conventional and/or custom, may also be included. Similarly, any switches shown in the FIGS. are conceptual only. Their function may be carried out through the operation of program logic, through dedicated logic, through the interaction of program control and dedicated logic, or even manually, the particular technique being selectable by the implementer as more specifically understood from the context.

In the claims hereof any element expressed as a means for performing a specified function is intended to encompass any way of performing that function including, for example, a) a combination of circuit elements which performs that function or b) software in any form, including, therefore, firmware, microcode or the like, combined with appropriate circuitry for executing that software to perform the function. The invention as defined by such claims resides in the fact that the functionalities provided by the various recited means are combined and brought together in the manner which the claims call for. Applicant thus regards any means which can provide those functionalities as equivalent as those shown herein.

FIG. 1 shows a block diagram of one embodiment of the present invention. This embodiment accepts as input, on lead 103, an incoming data signal for which the clock needs to be recovered. The data signal may be at one of several known frequencies and have an arbitrary phase. The incoming data signal is generated at a transmitter (not shown) and it may change states at periodic intervals as defined by a clock of the transmitter.

The general structure of the embodiment of the invention shown in FIG. 1 is as follows. An incoming data signal on lead 103 is fed into the gate of gated oscillator 105 and into inverter 107. The output of gated oscillator 105, on lead 113, is fed into NOR gate 117. The output of inverter 107, on lead 109, is fed into the gate of gated oscillator 111. The output of gated oscillator 111, on lead 115, is also fed into NOR gate 117. The output of NOR gate 117, on lead 119, is the periodic waveform or "recovered clock" which may be used by the receiver to appropriately read the incoming data signal.

More specifically, in accordance with the principles of the invention, each of gated oscillators 105 and 111 is able to generate an oscillatory signal at one of several predefined frequencies, one of which is the same frequency as the transmitter's clock. Furthermore, each of gated oscillators 105 and 111 outputs no signal when its gate input is a logic 1 and outputs when its gate input is a logic 0 a periodic waveform that starts at the same point in its oscillatory cycle, e.g., at zero phase, when the gate input first becomes a logic 0.

Within gated oscillator 105 are 1) at least two different "internal" gated oscillators 151 and 153 and 2) a selector 155 for selecting the output of one of the internal gated oscillators.

Each of internal gated oscillators 151 and 153 is made up of a different number of delay elements 161 and at least one gatable element 163. Delay elements 161 may be single ended inverters or differential inverters, as in the embodiment of the invention shown in FIG. 1. Gatable element 163 can controllably prevent passage of any signal through itself. Gatable element 163 may also be a single ended inverter or a differential inverter. Furthermore, gatable element 163 may also be noninverting.

Each of internal gated oscillators 151 and 153, when activated, i.e., when gatable element 163 is enabled so that a signal can pass through it, oscillates so as to generate a different frequency clock signal. In order for oscillation to take place, the number of inversions in each of internal gated oscillators 151 and 153 must effectively be odd. Gatable element 163, when disabled, shuts down the internal gated oscillator by preventing passage of any signal through itself. Consequently when any of gatable elements 163 is reenabled, the one of internal gated oscillators 151 and 153 to which it belongs begins to oscillate with zero phase.

Gatable elements 163 of gated oscillator 105 are responsive to the incoming data signal on lead 103.

The output of each of internal gated oscillators 151 and 153 is coupled to a respective input of selector 155, which is, for example, a multiplexer. Control signal SPEED, on lead 121, is coupled as in input to selector 155 and is used to determine which of internal gated oscillators 151 and 153 has its output passed as the output of selector 155, and ultimately as the output of gated oscillator 105. Alternatively, any structure that can control oscillation of, or the passing of outputs from, internal gated oscillators 151 and 153, so that at most one of their outputs is supplied as an output from gated oscillators 105 and 111 may be used to implement the function of selector 155. For example, selector 155 may be an OR gate with controllably selectable inputs.

Gated oscillator 111 has an identical structure to gated oscillator 105, except that gatable elements 163 of gated oscillator 111 are responsive to the inverted incoming data signal on lead 109. Advantageously, when all of the components shown in FIG. 1 are manufactured on a single integrated circuit, each of gated oscillators 105 and 111 will have substantially identical operating characteristics.

Note that within each of gated oscillators 105 and 111 there may be more than two internal gated oscillators, that each of selectors 155 may be capable of selecting from more than two inputs, and that control signal SPEED may be more than one bit of information. Thus, clocks at more than two different frequencies may be recovered. For example, the frequency of the recovered clock may be different for each incoming packet.

The illustrative embodiment in FIG. 1 advantageously also comprises phase-locked loop 141, which includes a) gated oscillators 123, b) divide-by-n 125 (optional) e.g., implemented by a counter, c) phase detector 127, and d) loop filter 129. The design and operation of phase-locked loops is well known to those of ordinary skill in the art. Variable frequency oscillator 123 is typically an exact copy of one of internal gated oscillators 151 or 153, most often the one generating the highest frequency.

Phase-locked loop 141 creates a bias voltage which is supplied as an output on lead 130. The bias voltage is supplied to the control input of each of gated oscillators 105 and 111, as well as being fed back into phase locked loop 141 at its control input. The value of the bias voltage biases delay elements 161, and also possibly gated element 163, within gated oscillators 105 and 111, regulating the length of the delay they each cause.

Figure 2:
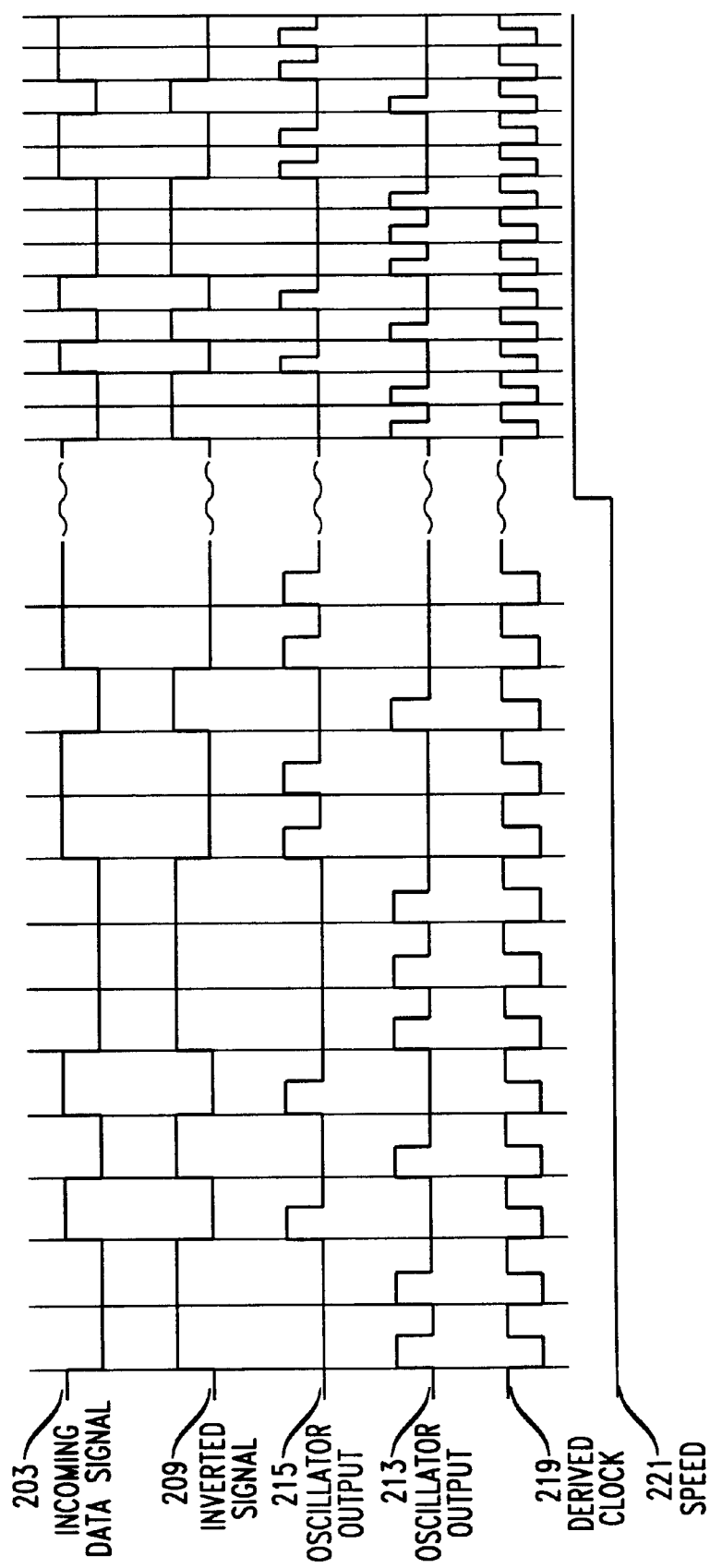
FIG. 2 is an exemplary timing diagram.

FIG. 2 is an exemplary timing diagram showing a) waveform 203, which is a representative example of an incoming data signal such as might be received on lead 103 (FIG. 1), b) various signals generated internal to the circuit of FIG. 1 given the exemplary incoming data signal, and c) the resulting recovered clock 219, which is supplied as an output from NOR gate 117 on lead 119. The various signals generated internal to the circuit of FIG. 1 that are shown in FIG. 2 include 1) inverted data signal 209, which is the output from inverter 107 on lead 109; 2) oscillator output 213, which is the waveform produced at the output of gated oscillator 105; and 3) oscillator output 215, which is the waveform produced at the output of gated oscillator 111.

Also shown in FIG. 2 is a representative example of signal SPEED of FIG. 1, shown as waveform SPEED 221. Control signal SPEED determines the frequency of the recovered clock. As a result, FIG. 2 has essentially two sections, one where waveform SPEED 221 is low, and one where it is high. The frequency of recovered clock 219 when waveform SPEED 221 is low is half of that when waveform SPEED 221 is high. It is necessary to have the recovered clock be twice as fast when waveform SPEED 221 is high than it has when waveform SPEED 221 is low because the incoming data signal depicted as waveform 203 has twice the frequency when waveform SPEED 221 is high than it has when waveform SPEED 221 is low, necessitating that the recovered clock be twice as fast for accurate data recovery.

Note that for the examples shown in FIG. 2 the exact point with reference to waveform 203 and the other signals shown in FIG. 2 at which signal SPEED changes from low to high is undefined, because in this example there is a time gap in the incoming data signal on lead 103 during which the change of the value of signal SPEED occurs.

Although the generation of signal SPEED is not shown herein, it will be recognized by those of ordinary skill in the art that it can be generated in any conventional manner that is appropriate to the application for which burst mode clock recovery is necessary. For example, signal SPEED may be fixed at a particular value, it may be set by a logic circuit that is responsive to the incoming data signal on lead 103, or it may be set by a logic circuit that is independent of incoming data signal on lead 103. Thus, for example, the value of signal SPEED may be changed during the course of reception of a packet, e.g., after an initial frequency indicating header has been received.

Returning to FIG. 1, the circuit shown therein operates as follows. After the circuit is powered on, phase-locked loop 141 achieves lock, creating the bias voltage. Thereafter, whenever the incoming data signal on lead 103 is a logic 1, gated oscillator 105 is idle and it outputs a logic 0 waveform. This may be achieved by having, for example, none of internal gated oscillators 151 and 153 oscillate, i.e., by disabling gatable element 163 therein, so that regardless of the value of signal SPEED there is no oscillating signal that can be supplied as an output by selector 155. This allows each of internal gated oscillators 151 and 153 of gated oscillator 105, when eventually activated, to begin oscillating at zero phase.

When the incoming data signal on lead 103 becomes a logic 0, internal gated oscillators 151 and 153 of gated oscillator 105 each begins to oscillate at its respective frequency, beginning at zero phase. The output of the particular one of internal gated oscillators 151 and 153 that is selected by selector 155 of gated oscillator 105 is supplied by gated oscillator 105, on lead 113, as its output. The particular one of internal gated oscillators 151 and 153 that is selected by selector 155 is determined as a function of signal SPEED. Internal gated oscillators 151 and 153 of gated oscillator 105 continue to oscillate so long as the incoming data signal remains a logic 1.

Conversely, because the signal supplied to gatable elements 163 of gated oscillator 111 is the inverse of the incoming data signal, after the circuit is powered on and phase-locked loop 141 becomes stable, whenever the incoming data signal on lead 103 is a logic 0, gated oscillator 111 is idle. Likewise, whenever the incoming data signal on lead 103 is a logic 1, internal gated oscillators 151 and 153 of gated oscillator 111 each begins to oscillate at its respective frequency, starting at zero phase. The output of the particular one of internal gated oscillators 151 and 153 that is selected by selector 155 of gated oscillator 111 is supplied as an output by gated oscillator 111 on lead 115. The particular one of internal gated oscillators 151 and 153 that is selected by selector 155 is selected by signal SPEED. Internal gated oscillators 151 and 153 of gated oscillator 111 continue to oscillate so long as the incoming data signal remains a logic 1.

Thus, whenever there is a voltage transition, i.e., from logic 1 to logic 0 or from logic 0 to logic 1 on incoming data signal on lead 103, one of gated oscillators 105 and 111 becomes idle while the other starts to oscillate at substantially the same time. In other words, the circuit of FIG. 1 is configured in such a way that each of the gated oscillators 105 and 111 is arranged such that when its gate input signal level experiences a change from logic 0 to logic 1, it ceases oscillation. Conversely, when the input of each experiences a change from logic 1 to logic 0, it immediately begins oscillation with phase zero. However, because of inverter 107 only one of gated oscillators 105 and 111 has a gate signal input that causes it to oscillate at any one time. Thus, one and only one of the gated oscillators 105 and 111 is operating to produce a pulse sequence at any one time.

The respective outputs of gated oscillator 105 and gated oscillator 111 are fed into NOR gate 117, which combines them and supplies as an output the inverse of its one input that is receiving an oscillating signal. Thus, the output of NOR gate 117 is a recovered clock that may be used to extract information from the incoming data signal on lead 103.

It may be desirable to delay incoming data signal 103 by the amount of delay in selector 155, gatable elements 163, NOR gate 117 and one half of inverter 107 prior to using the recovered clock to extract the information. Doing so better synchronizes the incoming data signal with the recovered clock by compensating for the delays in the clock recovery process. Alternatively, it may be desirable to buffer delay incoming data signal 103 after it is supplied to inverter 107 but before it is supplied to gated oscillator 105 by the same amount as the delay through inverter 107, and to then delay the incoming data signal 103 by the amount of delay in selector 155, gatable elements 163, NOR gate 117, and inverter 107.

To further reduce problems associated with jitter and pulse width distortion of the data, which can cause runt pulses if the next cycle of the selected oscillator starts slightly before the next transition of the incoming data signal, so that part of the new oscillation cycle might appear before being gated off, internal gated oscillators 151 and 153 and/or NOR gate 117 are arranged to have a faster rising edge than they do a falling edge, e.g., by arranging the impedances that relate to the rising edge to be less than the impedances that relate to the falling edge. Advantageously, doing so causes the resulting recovered clock on lead 119 to be free of runt pulses.

It will be clear to those of ordinary skill in the art how to substitute other logic functions, e.g., a NAND gate, for NOR gate 117. Similarly, arrangements which use conventional techniques for reversing whether "high" is "on" or logic 1 and "low" is "off" or logic 0 in any part of the system described herein is within the scope of the invention.

Figure 5:
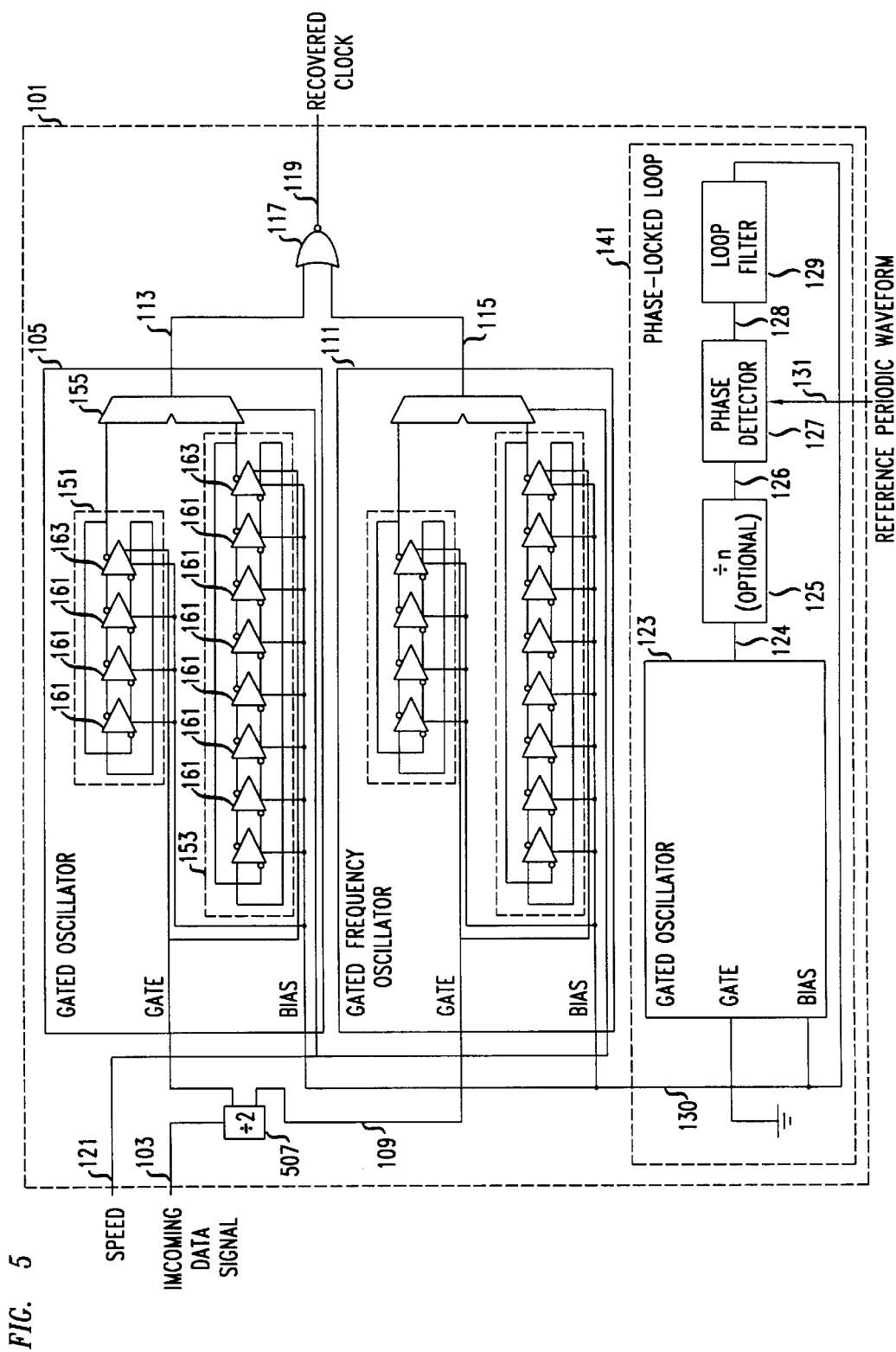
FIG. 5 shows an embodiment of the invention using a divide-by-two flip-flop.

In another embodiment of the invention, shown in FIG. 5, divide-by-two flip-flop 507, which may be a T-flip-flop is substituted for inverter 107. In such an arrangement the data is supplied to the T input of the flip-flop, the Q output of flip-flop is supplied to the gate of gated oscillator 105, and the $\overline{Q}$ output is supplied to the gate of gated oscillator 111. Advantageously, such an arrangement provides improved immunity to duty cycle distortion.

Figure 3:
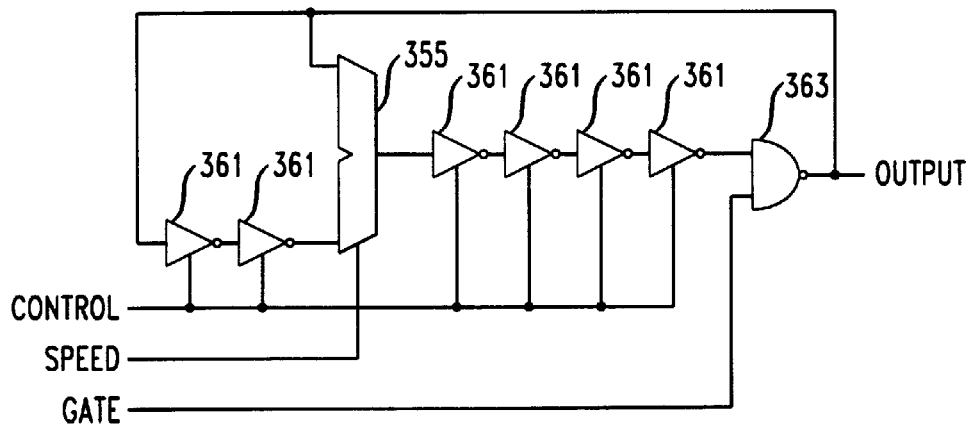
FIG. 3 shows a variable length internal gated oscillator for use in the embodiment of the invention shown in FIG. 1.

In another embodiment of the invention, instead of using alternative internal gated oscillators, a variable length internal gated oscillator may be employed. An exemplary embodiment of such a variable length internal gated oscillator is shown in FIG. 3. The variable length internal gated oscillator includes inverting delay elements 361, multiplexer 355 and NAND gate 363. Depending on which path is selected by multiplexer 355 in response to signal SPEED, either a chain length of five inversions or seven inversions are achieved. Note that this count includes the inversion which is part of NAND gate 363.

The multiplexer 355 and NAND gate 363 delay times are often insignificant as compared to the delay times of inverters 361. Consequently, the difference in the delay of the variable length internal gated oscillator as a function of signal SPEED is effectively 4 and 6. Thus, the recovered clock as a function of signal SPEED will have a relative cycle time of 1 to 1.5.

Figure 4:
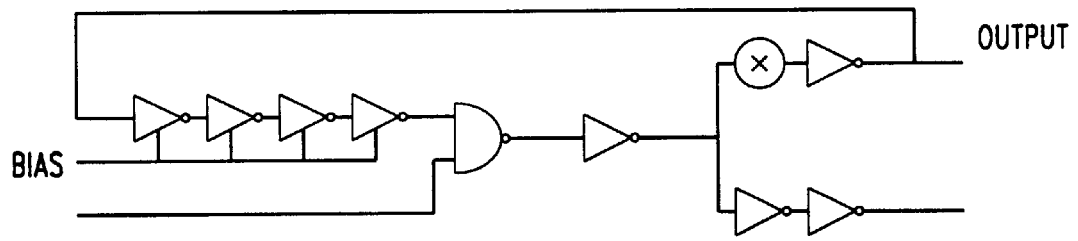
FIG. 4 shows an exemplary oscillator using a so-called "phase splitter"

FIG. 4 shows an exemplary structure that has a so-called "phase splitter". The structure may be configured as an oscillator by itself, e.g., as shown in FIG. 4. Alternatively, instead of feeding back the inverting output, the noninverting output is fed to the input of another identical structure and the output of the identical structure's inverting output is fed back to the input of the first structure as well as being taken as the output of the overall oscillator structure. Thus, two or more identical structures may be coupled together and yet have an odd number of inversions so as to achieve oscillation. This considerably broadens the number of frequencies that can be recovered using a single reference frequency as supplied by phase locked loop 141 (FIG. 1) using a single basic oscillator building block.

What is claimed is:

1. An apparatus for recovering a clock from an input data signal, said apparatus comprising:

means, operative when said input data signal has a first logic level, for generating a first oscillatory signal at a preselected one of at least a first or a second frequency;

means, operative when said input data signal has a second logic level complementary to said first logic level, for generating a second oscillatory signal at said preselected one of said at least first or second frequencies; and means for generating said recovered clock at said preselected one of said at least first or second frequency by combining said first oscillatory signal and said second oscillatory signal;

wherein said first oscillatory signal starts at a particular known phase when said means for generating said first oscillatory signal begins operating to generate said first oscillatory signal; and wherein said second oscillatory signal starts at a particular known phase when said means for generating said second oscillatory signal begins operating to generate said second oscillatory signal.

2. The invention as defined in claim 1 wherein said means for generating a first oscillatory signal further comprises:

a plurality of controllably operable delay lines each producing a different frequency signal as an output when operating, said controllably operable delay lines operating when said means for generating a first oscillatory signal is operative, each of said output signals beginning oscillation at said particular known phase when said means for generating a first oscillatory signal begins operating to generate said first oscillatory signal; and a selector for choosing the signal produced of a particular one of said plurality of delay lines to be said oscillatory signal generated by said means for generating a first oscillatory signal.

3. The invention as defined in claim 1 wherein said means for generating a second oscillatory signal further comprises:
a plurality of controllably operable delay lines each producing a different frequency signal as an output when operating, said controllably operable delay lines operating when said means for generating a second oscillatory signal is operative, each of said output signals beginning oscillation at said particular known phase when said means for generating a second oscillatory signal begins operating to generate said second oscillatory signal; and
a selector for choosing the signal produced of a particular one of said plurality of delay lines to be said oscillatory signal generated by said means for generating a second oscillatory signal.

4. The invention as defined in claim 1 wherein said means for generating a first oscillatory signal and said means for generating a second oscillatory signal are identical to within manufacturing tolerances.

5. The invention as defined in claim 1 wherein said means for generating a first oscillatory signal and said means for generating a second oscillatory signal are manufactured as part of a single integrated circuit.

6. The invention as defined in claim 1 wherein said means for generating a first oscillatory signal further comprises:
a plurality of controllably operable oscillators formed by a chain of inverters each producing a different frequency signal as an output when operating, said controllably operable oscillators operating when said means for generating a first oscillatory signal is operative, each of said output signals beginning oscillation at said particular known phase when said means for generating a first oscillatory signal begins operating to generate said first oscillatory signal; and
a selector for choosing the signal produced of a particular one of said plurality of oscillators formed by a chain of inverters to be said oscillatory signal generated by said means for generating a first oscillatory signal.

7. The invention as defined in claim 1 wherein said means for generating a second oscillatory signal further comprises:
a plurality of controllably operable oscillators formed by a chain of inverters each producing a different frequency signal as an output when operating, said controllably operable oscillators operating when said means for generating a second oscillatory signal is operative, each of said output signals beginning oscillation at said particular known phase when said means for generating a second oscillatory signal begins operating to generate said second oscillatory signal; and
a selector for choosing the signal produced of a particular one of said plurality of oscillators formed by a chain of inverters to be said oscillatory signal generated by said means for generating a second oscillatory signal.

8. The invention as defined in claim 1 wherein said means for generating a first oscillatory signal further comprises:
a controllably operable variable length oscillator formed by a chain of a controllable number of delay elements, the number of delay elements included in said chain at any time producing a signal as an output that is different in frequency from the output produced using any other number of said delay elements in said chain;
wherein said controllably operable variable length oscillator operates only when said means for generating a first oscillatory signal is operative, said output signal beginning oscillation at said particular known phase when said means for generating a first oscillatory signal begins operating to generate said first oscillatory signal.

9. The invention as defined in claim 1 wherein said means for generating a first oscillatory signal further comprises:
a controllably operable variable length oscillator formed by a chain of a controllable number of delay elements, the number of delay elements included in said chain at any time producing a signal as an output that is different in frequency from the output produced using any other number of said delay elements in said chain, said length of said chain being controlled using a multiplexer responsive to a speed indicating signal;
wherein said controllably operable variable length oscillator operates only when said means for generating a first oscillatory signal is operative, said output signal beginning oscillation at said particular known phase when said means for generating a first oscillatory signal begins operating to generate said first oscillatory signal.

10. The invention as defined in claim 1 wherein said means for generating a second oscillatory signal further comprises:
a controllably operable variable length oscillator formed by a chain of a controllable number of delay elements, the number of delay elements included in said chain at any time producing a signal as an output that is different in frequency from the output produced using any other number of said delay elements in said chain;
wherein said controllably operable variable length oscillator operates only when said means for generating a second oscillatory signal is operative, said output signal beginning oscillation at said particular known phase when said means for generating a second oscillatory signal begins operating to generate said second oscillatory signal.

11. The invention as defined in claim 1 wherein said means for generating a second oscillatory signal further comprises:
a controllably operable variable length oscillator formed by a chain of a controllable number of delay elements, the number of delay elements included in said chain at any time producing a signal as an output that is different in frequency from the output produced using any other number of said delay elements in said chain, said length of said chain being controlled using a multiplexer responsive to a speed indicating signal;
wherein said controllably operable variable length oscillator operates only when said means for generating a second oscillatory signal is operative, said output signal beginning oscillation at said particular known phase when said means for generating a second oscillatory signal begins operating to generate said second oscillatory signal.

12. The invention as defined in claim 1 wherein said means for generating a first oscillatory signal further comprises:
a plurality of controllably operable oscillators each formed by a chain including (i) delaying inverters that have a first delay therethrough and (ii) at least one phase splitter that has an inverting and a noninverting branch, said phase splitter being arranged to have said first delay whether or not its inverting branch is selected, each of said controllably operable oscillators producing a different frequency signal as an output when operating, said controllably operable oscillators operating when said means for generating a first oscillatory signal is operative, each of said output signals beginning oscillation at said particular known phase when said means for generating a first oscillatory signal begins operating to generate said first oscillatory signal.

13. The invention as defined in claim 1 wherein said preselected one of as least a first or a second frequency can be changed for every bit of said input data signal.

14. Apparatus for performing clock recovery for a burst mode input data signal comprising:

first and second gated oscillators each, when active, capable of producing as an output a clock signal having one of a plurality of frequencies, the particular frequency output at any time being a function of a speed selection signal and an independent bias signal, said first gated oscillator being active when said input data signal has a first value and said second gated oscillator being active when said input data signal has a complementary value to said first value; and a combiner for combining said outputs from said first and second gated oscillators;

wherein said clock signal produced by each of said first and second gated oscillators starts at a particular known phase when the one of said first and second gated oscillators producing it becomes active from being inactive.

15. The invention as defined in claim 14 wherein at least one of said first and second gated oscillators further comprises:

a plurality of controllably operable delay lines each producing a different frequency signal as an output when operating, each of said controllably operable delay lines operating when said at least one of said first and second gated oscillators is operating, each of said delay lines beginning oscillation upon becoming active from being inactive at said particular known phase; and a selector for choosing as an output of said at least one of said first and second gated oscillators the output of a particular one of said plurality of delay lines.

16. The invention as defined in claim 15 wherein at least one of said different length delay lines comprises a chain of at least two inverters.

17. The invention as defined in claim 15 wherein at least one of said different length delay lines comprises a phase splitter.

18. The invention as defined in claim 15 further comprising a bias signal generator for supplying said bias signal to said first and second gated oscillators for adjusting a delay length of delay elements included within each of said plurality of different length delay lines.

19. The invention as defined in claim 14 wherein said combiner is a NOR gate.

20. The invention as defined in claim 14 wherein said combiner responds faster to a rising edge than to a falling edge.

21. The invention as defined in claim 14 wherein at least one of said first and second gated oscillators further comprises:

a controllably-operable, controllably-variable length delay line, the length of said variable length delay line being set as a function of said speed selection signal, each different length of said controllably-operable, controllably-variable length delay line producing a signal as an output that is different in frequency from the output produced using any other length, said controllably-operable, controllably-variable delay line operating when said at least one of said first and second gated oscillators including it is operating, said delay line beginning oscillation upon becoming active from being inactive at said particular known phase.

22. The invention as defined in claim 14 wherein said first and second gated oscillators each contain at least one delay element, and wherein said apparatus further comprises a reference signal generator for supplying a reference signal to said first and second gated oscillators for adjusting a delay length for said at least one delay element of each of said first and second gated oscillators.

23. The invention as defined in claim 14 wherein said first and second gated oscillators and said combiner are manufactured as part of a single integrated circuit.

24. The invention as defined in claim 14 wherein said first and second gated oscillators are identical to within manufacturing tolerances.

25. The invention as defined in claim 14 further including an inverter for producing an inverted version of said data signal, wherein said data signal is supplied to said first gated oscillator and said inverted version of said data signal is supplied to said second gated oscillator.

26. The invention as defined in claim 14 further including a T-flip-flop, said data signal being coupled to the T input of said T-flip-flop, the Q output of said T-flip-flop being coupled to said first gated oscillator and the inverted $\overline{Q}$ output of said T-flip-flop being coupled to said second gated oscillator.

27. The invention as defined in claim 14 wherein said speed selection signal can be changed for every bit of said input data signal.

* * * * *